(12) United States Patent
Park

(10) Patent No.: US 8,008,164 B2
(45) Date of Patent: Aug. 30, 2011

(54) WAFER BONDING METHOD AND WAFER STRUCTURE

(75) Inventor: Sang-Joon Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 192 days.

(21) Appl. No.: 12/384,135

(22) Filed: Apr. 1, 2009

(65) Prior Publication Data
US 2009/0253245 A1    Oct. 8, 2009

(30) Foreign Application Priority Data
Apr. 7, 2008   (KR) .................. 10-2008-0032199

(51) Int. Cl.
*H01L 21/30* (2006.01)

(52) U.S. Cl. .......... 438/455; 438/118; 257/E21.48; 257/E21.519

(58) Field of Classification Search .......... 438/118, 438/455, 458; 257/E21.48, E21.519
See application file for complete search history.

(56) References Cited

U.S. PATENT DOCUMENTS
6,248,646 B1 * 6/2001 Okojie .................. 438/459
2004/0248377 A1 * 12/2004 Yoo et al. ............... 438/458
* cited by examiner

*Primary Examiner* — Michael S Lebentritt
*Assistant Examiner* — Daniel Whalen
(74) *Attorney, Agent, or Firm* — Mills & Onello, LLP

(57) ABSTRACT

A wafer bonding method includes providing a primary wafer and a plurality of secondary wafers, wherein the primary wafer is larger than the secondary wafers. An intermediate material layer is formed on at least one of a bonding surface of the primary wafer and bonding surfaces of the secondary wafers. The intermediate material layer has a thermal expansion coefficient greater than the thermal expansion coefficient of the primary wafer and the thermal expansion coefficient of the secondary wafers. The secondary wafers are bonded onto the primary wafer.

11 Claims, 6 Drawing Sheets

WAFER BONDING METHOD AND WAFER STRUCTURE

CROSS-REFERENCE TO RELATED APPLICATION

This application claims priority from Korean Patent Application No. 10-2008-0032199 filed on Apr. 7, 2008 in the Korean Intellectual Property Office, the disclosure of which is incorporated herein by reference in its entirety.

BACKGROUND OF THE INVENTION

1. Field of the Invention

The present invention relates to a wafer bonding method and a wafer structure obtained by the wafer bonding method.

2. Description of the Related Art

Small wafers having a diameter of, for example, 6 inches or less, have been widely used in the manufacture of light-emitting devices such as laser emitting diodes (LEDs) or laser diodes (LDs) since it is relatively difficult to fabricate larger wafers having a diameter of 6 inches or more for use in the manufacture of light-emitting devices.

However, the use of small wafers makes it difficult to reduce the manufacturing cost of light emitting devices and typically requires the development and use of equipment appropriate for handling small wafers.

SUMMARY OF THE INVENTION

Described herein are wafer bonding methods and wafer structures that can utilize small wafers with improved ease, efficiency and cost. In the bonding method, multiple small (secondary) wafers are bonded to a large (primary) wafer; and because the primary wafer is large, equipment appropriate for handling large wafers can be used without requiring additional equipment designed for small wafers.

In one embodiment of the wafer bonding method, described herein, a primary wafer and a plurality of secondary wafers are provided, wherein the primary wafer is larger than the secondary wafers—in the sense that each of the wafers has a bonding surface, and the bonding surface of the primary wafer has a greater area than the bonding surface of each secondary wafer to which it is to be bonded. An intermediate material layer is formed on at least one of a bonding surface of the primary wafer and bonding surfaces of the secondary wafers, and the intermediate material layer has a thermal expansion coefficient greater than the thermal expansion coefficients of the primary wafer and of the secondary wafers. The bonding surfaces of the secondary wafers are then bonded onto the bonding surface of the primary wafer so that multiple secondary wafers are mounted on the bonding surface of the primary wafer.

In another embodiment of the wafer bonding method, a conductive wafer and a plurality of insulating wafers are provided; the conductive wafer is larger than the insulating wafers (i.e., the bonding surface of the conductive wafer is larger than the bonding surface of each insulating wafer to which it is to be bonded). A metal layer or an organic layer is formed on at least one of a bonding surface of the conductive wafer and bonding surfaces of the insulating wafers as an intermediate material layer. The insulating wafers are layed over the conductive wafer so that the bonding surfaces of the insulating wafers can face the bonding surface of the conductive wafer. The insulating wafers are then bonded onto the conductive wafer by performing thermal treatment on the conductive wafer and the insulating wafers so that multiple insulating wafers are mounted on the bonding surface of the conductive wafer.

An embodiment of a wafer structure that can be produced by the above-outlined methods includes a primary wafer; a plurality of secondary wafers bonded onto the primary wafer; and an intermediate material layer interposed between the primary wafer and the secondary wafers. The secondary wafers are smaller than the primary wafer (i.e., the bonding surface of each of the secondary wafers is smaller than the bonding surface of primary wafer to which it is bonded), and the intermediate layer has a thermal expansion coefficient greater than the thermal expansion coefficient of the primary wafer and the thermal expansion coefficient of the secondary wafers.

Another embodiment of the wafer structure includes a conductive wafer, a plurality of insulating wafers bonded onto the primary wafer, and an intermediate material layer interposed between the primary wafer and the secondary wafers. The insulating wafers are smaller than the primary wafer, and the intermediate layer includes a metal layer or an organic layer.

BRIEF DESCRIPTION OF THE DRAWINGS

The above and other aspects and features of the present invention will become more apparent by describing in detail exemplary embodiments thereof with reference to the attached drawings, in which.

DETAILED DESCRIPTION OF THE EXEMPLARY EMBODIMENTS

Figure 1:
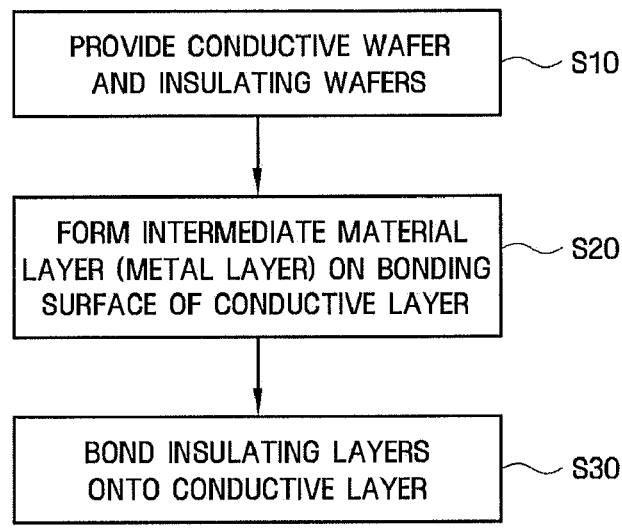
FIG. 1 is a flowchart of a first exemplary embodiment of the wafer bonding method.

The methods and wafer structure will now be described more fully with reference to the accompanying drawings, in which exemplary embodiments are shown. The invention may, however, be embodied in many different forms and should not be construed as being limited to the embodiments set forth herein. Rather, these embodiments are provided for illustrative purposes and so that this disclosure will be thorough and complete and, by way of examples, will fully convey the broader concepts of the invention to those skilled in the art.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout. As used herein the term "and/or" includes any and all combinations of one or more of the associated listed items.

It will be understood that, although the terms first, second, primary, secondary, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, for example, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Furthermore, relative terms such as "below," "beneath," or "lower," "above," and "upper" may be used herein to describe one element's relationship to another element as illustrated in the accompanying drawings. It will be understood that relative terms are intended to encompass different orientations of the device in addition to the orientation depicted in the accompanying drawings. For example, if the device in the accompanying drawings is turned over, elements described as being on the "lower" side of other elements would then be oriented on "upper" sides of the other elements. Similarly, if the device in one of the figures is turned over, elements described as "below" or "beneath" other elements would then be oriented "above" the other elements. Therefore, the exemplary terms "below" and "beneath" can, therefore, encompass both an orientation of above and below.

Figure 2:
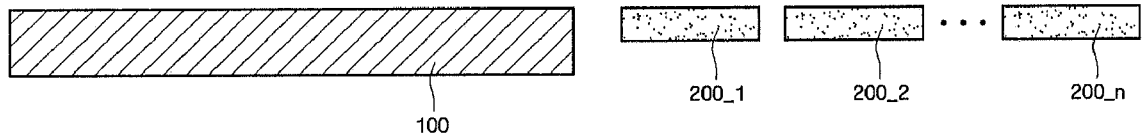
FIGS. 2 through 5 are diagrams illustrating the wafer bonding method of the first exemplary embodiment.

Referring to the flowchart of FIG. 1 and the illustration of FIG. 2, the method is initiated by providing an electrically conductive wafer 100 and a plurality of electrically insulating wafers 200_1 through 200_$n$ (S10).

More specifically, each of the dimensions of the conductive wafer 100 can be larger size than the corresponding dimensions of the insulating wafers 200_1 through 200_$n$. Thus, if the conductive wafer 100 is laid over the insulating wafers 200_1 through 200_$n$, the insulating wafers 200_1 through 200_$n$ can be hidden from view by the conductive wafer 100.

If the conductive wafer 100 and the insulating wafers 200_1 through 200_$n$ are all circular (cylindrical with a vertical axis of symmetry in the orientation of FIG. 2), the diameter of the conductive wafer 100 can be greater than the diameter of the insulating wafers 200_1 through 200_$n$. For example, the conductive wafer 100 can have a diameter of 6 inches (about 150 mm) or more, and the insulating wafers 200_1 through 200_$n$ can have a diameter of 6 inches or less. If the conductive wafer 100 and the insulating wafers 200_1 through 200_$n$ are all rectangular (in a plane orthogonal to the illustration of FIG. 2), the diagonal length of the conductive wafer 100 (across this orthogonal plane) can be greater than the corresponding diagonal length of the insulating wafers 200_1 through 200_$n$.

The conductive wafer 100 can include, e.g., silicon (Si), strained silicon, a silicon alloy, silicon-on-insulator (SOI), silicon carbide (SiC), silicon germanium (SiGe), silicon germanium carbide (SiGeC), germanium (Ge), a germanium alloy, gallium arsenide (GaAs), indium arsenide (InAs), a Group III-V semiconductor, a Group II-VI semiconductor or a combination or stack thereof, though the conductive wafer is not restricted thereto.

The insulating wafers 200_1 through 200_$n$ can include, e.g., sapphire ($Al_2O_3$), aluminum nitride, boron nitride, silicon oxide, silicon nitride, beryllium nitride, quartz or a combination or stack thereof, though the insulating wafer is not restricted thereto.

In the first exemplary embodiment, the conductive wafer 100 is a silicon wafer, and the insulating wafers 200_1 through 200_$n$ are sapphire wafers.

In order to properly bond the conductive wafer 100 and the insulating wafers 200_1 through 200_$n$, the bonding surfaces of the conductive wafers 100 and the insulating wafers 200_1 through 200_$n$ can be substantially flat and smooth. Conversely, it is difficult to properly bond the conductive wafer 100 and the insulating wafers 200_1 through 200_$n$ if the bonding surfaces of the conductive wafer 100 and the insulating wafers 200_1 through 200_$n$ are uneven.

An intermediate material layer 120, which is interposed between the conductive wafer 100 and the insulating wafers 200_1 through 200_$n$, can compensate for the unevenness of the conductive wafer 100 or the insulating wafers 200_1 through 200_$n$, especially when having a sufficient thickness. The intermediate material layer 120 will be described later in further detail.

In addition, the bonding surfaces of the conductive wafer 100 and the insulating wafers 200_1 through 200_$n$ may need to be clean.

Accordingly, the bonding surfaces of the conductive wafer 100 and the insulating wafers 200_1 through 200_$n$ can be properly washed, if necessary, because impurities (such as particles or dust) on the bonding surfaces of the conductive wafer 100 and the insulating wafers 200_1 through 200_$n$ may become contamination sources. Impurities between the conductive wafer 100 and the insulating wafers 200_1 through 200_$n$ may weaken the bonding energy between the conductive wafer 100 and the insulating wafers 200_1 through 200_$n$. The weaker the bonding energy between the conductive wafer 100 and the insulating wafers 200_1 through 200_$n$, the more likely the conductive wafer 100 and the insulating wafers 200_1 through 200_$n$ will easily detach from each other.

Figure 3:
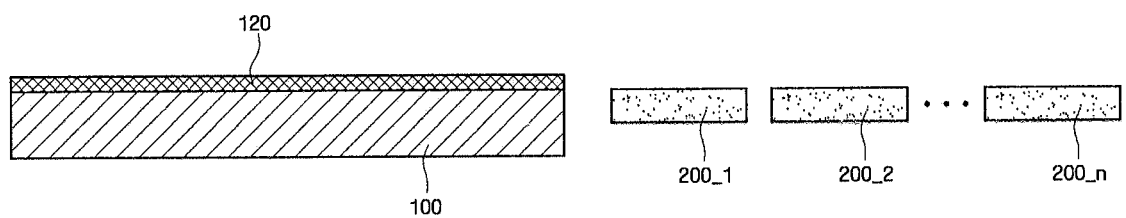

Referring to FIGS. 1 and 3, the intermediate material layer 120 can be formed on the bonding surface of the conductive wafer 100 (S20).

More specifically, the thermal expansion coefficient of the intermediate material layer 120 can be greater than the thermal expansion coefficient of the conductive wafer 100 and the thermal expansion coefficient of the insulating wafers 200_1 through 200_$n$.

If the conductive wafer 100 is a silicon wafer having a thermal expansion coefficient of about 2.5E-7/° C. and the insulating wafers 200_1 through 200_$n$ are sapphire wafers having a thermal expansion coefficient of about 8.4E-6/° C., the thermal expansion coefficient of the intermediate material layer 120 may only need to be greater than the thermal expansion coefficient of sapphire. For example, the thermal expansion coefficient of the intermediate material layer 120 can be greater than about 1E-6/° C. and less than about 1E-4/° C.

Figure 4:
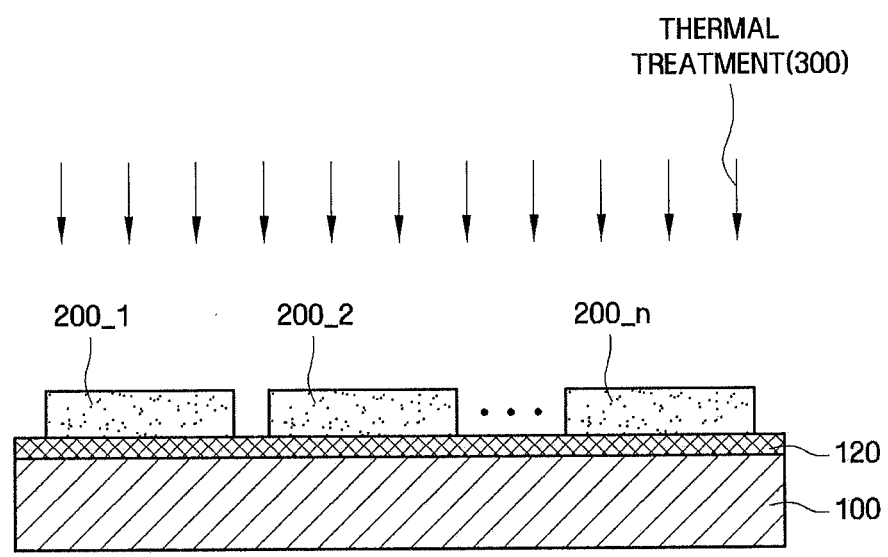

The intermediate material layer 120 can be interposed between the conductive wafer 100 and the insulating wafers 200_1 through 200_n, as shown in FIG. 4. If the thermal expansion coefficient of the intermediate material layer 120 is greater than the thermal expansion coefficient of the conductive wafer 100 and the thermal expansion coefficient of the insulating wafers 200_1 through 200_n, the intermediate material layer 120 can serve as a buffer for releasing the stress between the conductive wafer 100 and the insulating wafers 200_1 through 200_n, which may be caused by the difference between the thermal expansion coefficient of the conductive wafer 100 and the thermal expansion coefficient of the insulating wafers 200_1 through 200_n.

In the first exemplary embodiment, the intermediate material layer 120 can include a metal layer. The metal layer can be formed of at least one of gold (Au), tin (Sn), aluminum (Al), lead (Pb), chromium (Cr), and titanium (Ti). More specifically, the metal layer can have a single-layer structure or a multilayer structure including a gold layer, a tin layer, an aluminum layer, a lead layer, a chromium layer, a titanium layer or a combination thereof. For example, the metal layer can have a single-layer structure including a gold layer, a double-layer structure including a gold layer and a tin layer, or a multilayer structure in which a gold layer and a tin layer are alternately stacked.

Figure 5:
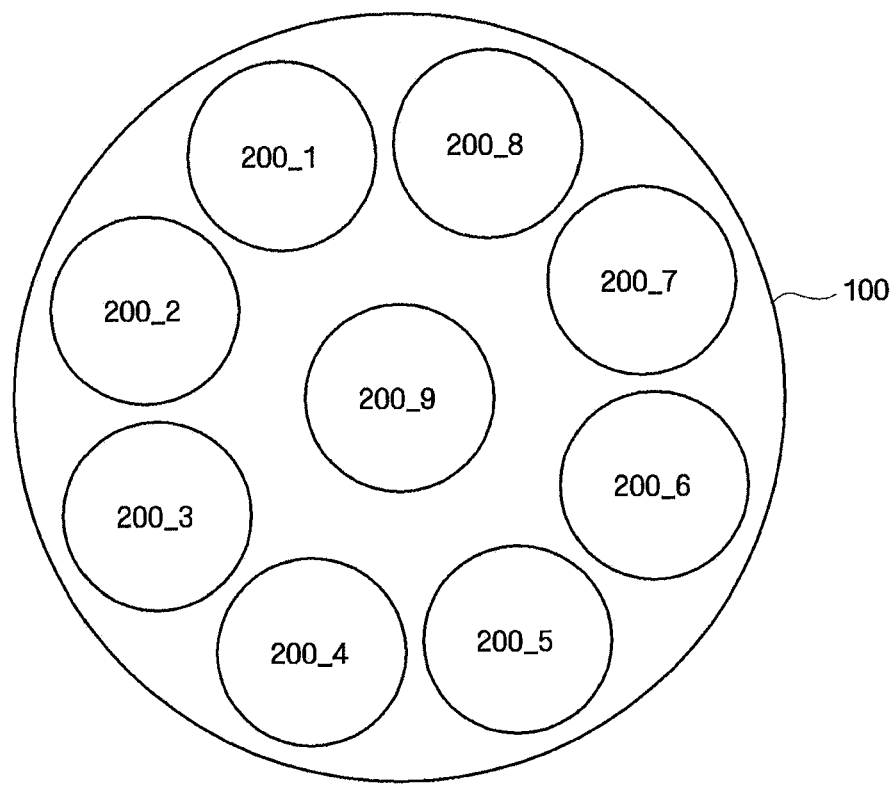

Referring to FIGS. 1, 4 and 5, the insulating wafers 200_1 through 200_n can be bonded onto the conductive wafer 100 (S30). For example, referring to FIG. 5, a total of nine insulating wafers 200_1 through 200_9, each having a diameter of 2 inches can be laid over a conductive wafer 100 having a diameter of, for example, 8 inches so that the bonding surfaces of the nine insulating wafers 200_1 through 200_9 can face the bonding surface of the conductive wafer 100.

Thereafter, thermal treatment can be performed on the conductive wafer 100 and the insulating wafers 200_1 through 200_n to bond the surfaces. Alternatively, the insulating wafers 200_1 through 200_n can be bonded onto the conductive wafer 100 by pressing the insulating wafers 200_1 through 200_n on the conductive wafer 100 while performing the thermal treatment 300.

The thermal treatment 300 can be performed at a temperature that is the same as or lower than the melting point of the intermediate material layer 120. If the intermediate material layer 120 includes a single gold layer, the thermal treatment 300 can be performed at a temperature of about 375-450° C. If the thermal treatment 300 is performed at too high a temperature, gold in the intermediate material layer 120 may infiltrate into the conductive wafer 100 or the insulating wafers 200_1 through 200_n, and may thus deteriorate the properties of the conductive wafer 100 or the insulating wafers 200_1 through 200_n. On the other hand, if the thermal treatment 300 is performed at too low a temperature, the performance of pre-fabricated devices may deteriorate.

The temperature at which the thermal treatment 300 should be performed may be determined in consideration of the intermediate material layer 120 and/or various process conditions. For example, the temperature at which the thermal treatment 300 should be performed can be higher when the intermediate material layer 120 is thick than when the intermediate material layer 120 is thin.

A wafer structure obtained by the wafer bonding method of the first exemplary embodiment will hereinafter be described in further detail with reference to FIG. 4. Referring to FIG. 4, the wafer structure obtained by the first exemplary embodiment of the wafer bonding method can include the conductive wafer 100, the insulating wafers 200_1 through 200_n bonded onto the conductive wafer 100, and the intermediate material layer 120 interposed between the conductive wafer 100 and the insulating wafers 200_1 through 200_n. As shown, the size of the conductive wafer 100 can be larger than the size of the insulating wafers 200_1 through 200_n. The intermediate material layer 120 can include a metal layer, and the thermal expansion coefficient of the intermediate material layer 120 can be greater than the thermal expansion coefficient of the conductive wafer 100 and the thermal expansion coefficient of the insulating wafers 200_1 through 200_n.

In the first exemplary embodiment, the insulating wafers 200_1 through 200_n are bonded onto the conductive wafer 100 after the formation of the intermediate material layer 120 on the conductive wafer 100. Consequently, the intermediate material layer 120 can be formed even on portions of the conductive wafer 100 exposed among the insulating wafers 200_1 through 200_n.

According to the first exemplary embodiment, it is possible to bond a plurality of small insulating wafers onto a large conductive wafer by simply using equipment appropriate for the large conductive wafer without a requirement of additional equipment appropriate for handling the small insulating wafers. In addition, it is possible to improve throughput by fabricating a considerable number of insulating wafers at the same time. Accordingly, it is possible to reduce the manufacturing cost of products obtained by using insulating wafers.

In the first exemplary embodiment, the insulating wafers 200_1 through 200_n are bonded onto the conductive wafer 100. However, the broader method is not restricted to this embodiment. That is, the method can be employed not only to bond a plurality of small insulating wafers onto a large conductive wafer but also to the bonding of a plurality of small conductive wafers onto a large insulating wafer.

Figure 6:
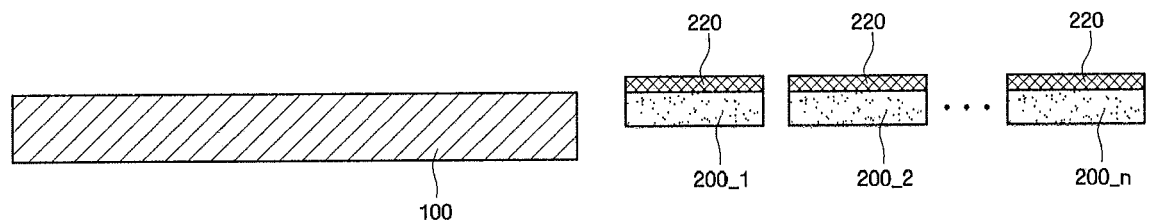
FIGS. 6 and 7 are diagrams illustrating a second exemplary embodiment of the wafer bonding method.
Figure 7:
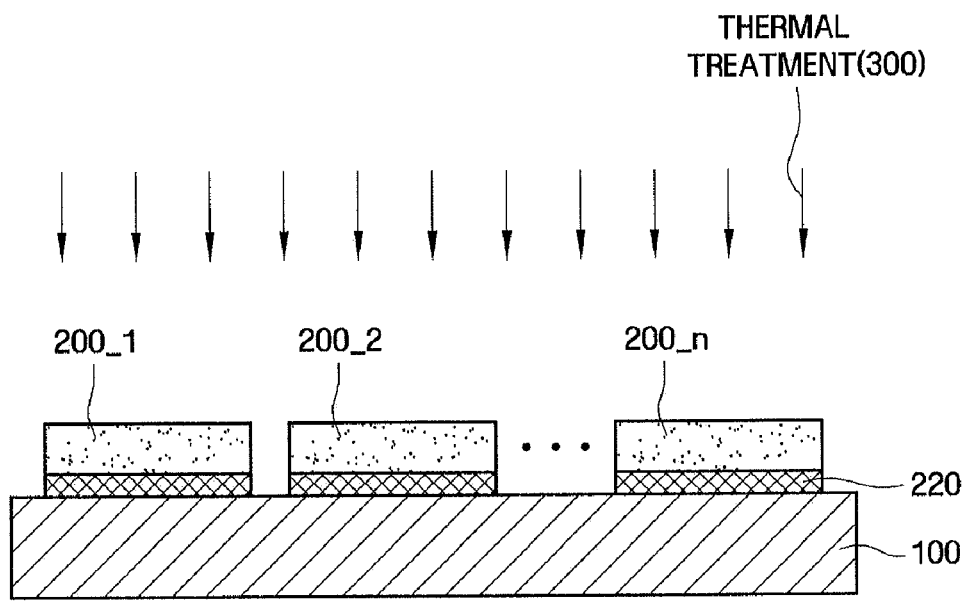

A second exemplary embodiment of the wafer bonding method, illustrated in FIGS. 6 and 7, is different from the first exemplary embodiment of the wafer bonding method in that a metal layer is formed, not on the bonding surface of a conductive wafer 100, but on the bonding surfaces of a plurality of insulating wafers 200_1 through 200_n. In the second exemplary embodiment, the insulating wafers 200_1 through 200_n can be bonded onto the conductive wafer 100 after the formation of an intermediate material layer 220 on the insulating wafers 200_1 through 200_n. Consequently, referring to FIG. 7, the intermediate material layer 220 may not be formed on portions of the conductive wafer 100 exposed among the insulating wafers 200_1 through 200_n.

Alternatively, the intermediate material layer 220 can be formed not only on the bonding surface of the conductive wafer 100 but also on the bonding surfaces of the insulating wafers 200_1 through 200_n; and then, the insulating wafers 200_1 through 200_n can be bonded onto the conductive wafer 100.

Figure 8:
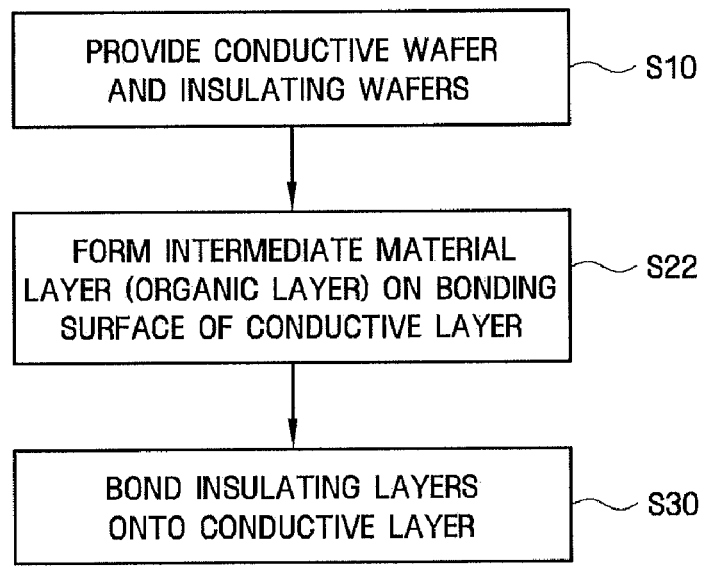
FIG. 8 is a flowchart of a third exemplary embodiment of the wafer bonding method.
Figure 9:
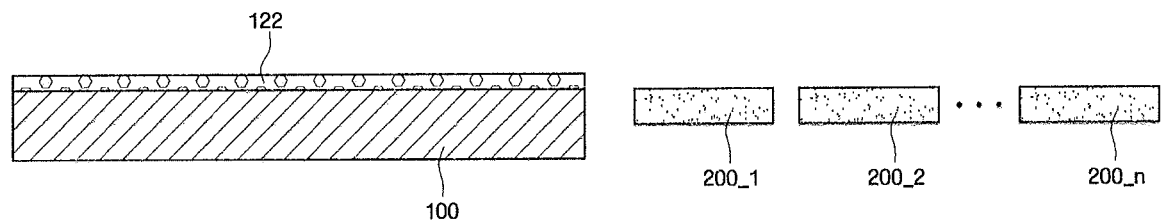
FIGS. 9 and 10 are diagrams illustrating the third exemplary embodiment of the wafer bonding method.

Referring to the flowchart of a third exemplary embodiment of the wafer bonding method, provided as FIG. 8, a conductive wafer 100 and a plurality of insulating wafers 200_1 through 200_n are again provided (S10). Referring to FIGS. 8 and 9, an intermediate material layer 122 (i.e., an organic layer) can be formed on the bonding surface of the conductive wafer 100 (S22).

If the conductive wafer 100 is a silicon wafer having a thermal expansion coefficient of about $2.5\text{E-}7/°$ C. and if the insulating wafers 200_1 through 200_n are sapphire wafers having a thermal expansion coefficient of about $8.4\text{E-}6/°$ C., the thermal expansion coefficient of the intermediate material layer 122 may only need to be greater than the thermal expansion coefficient of sapphire. For example, the thermal expansion coefficient of the intermediate material layer 122 can be greater than about $1\text{E-}6/°$ C. and less than about $1\text{E-}4/°$ C.

In the third exemplary embodiment, the intermediate material layer 122 can include an organic layer. The organic layer can be formed of benzocyclobutene (BCB), for example, CYCLOTENE, which is manufactured by Dow Chemical Company (Midland, Mich.).

Figure 10:
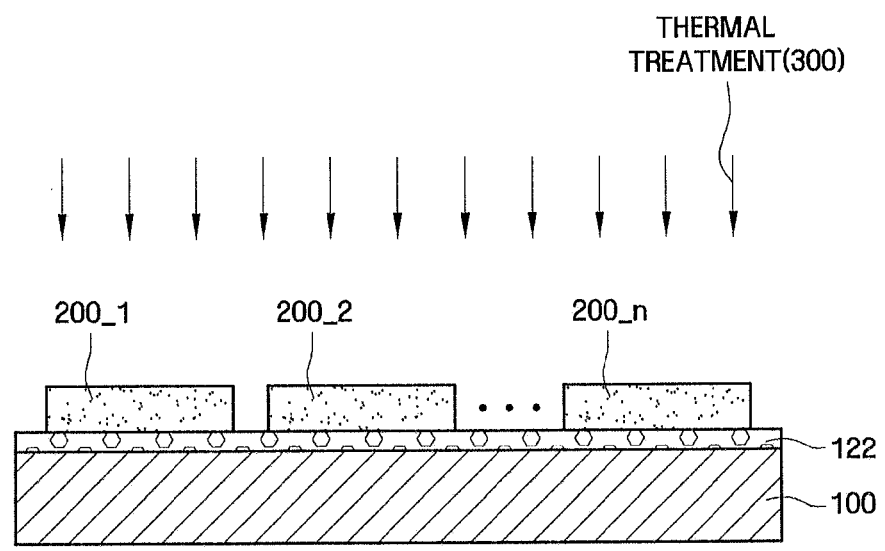

BCB is an appropriate material for use in the fabrication of semiconductor devices. Once thermally treated or cured (as shown in FIG. 10), BCB may become robust against most wet etchants and may thus be difficult to remove. In general, BCB can only be removed by dry etching.

BCB causes less stress than silicon oxide (silica, $SiO_2$). Consequently, even if a thick BCB layer is formed as the intermediate material layer 122, the intermediate material layer 122 may be unlikely to cause cracks in the conductive wafer 100 or to cause the conductive wafer 100 to bend.

The formation of a BCB layer as the intermediate material layer 122 is relatively simple. Specifically, the intermediate material layer 122 can be formed by applying BCB on the conductive wafer 100 using a spin coating method and vitrifying the BCB.

Referring to FIGS. 8 and 10, the insulating wafers 200_1 through 200_n can be bonded onto the conductive wafer 100 (S30). More specifically, the insulating wafers 200_1 through 200_n can be laid over the conductive wafer 100 so that the bonding surfaces of the insulating wafers 200_1 through 200_n face the bonding surface of the conductive wafer 100. Thereafter, the insulating wafers 200_1 through 200_n can be bonded onto the conductive wafer 100 by performing thermal treatment 300.

The thermal treatment 300 can be performed at a temperature profile at which the intermediate material layer 122 (i.e., BCB) can be vitrified (i.e., converted into a glass or glass-like amorphous solid). BCB is initially in a prepolymer state after being spin-coated on the conductive wafer 100. After the thermal treatment 300, however, about 70% of the BCB can become vitrified. Once vitrified, BCB may be able to firmly bond the insulating wafers 200_1 through 200_n onto the conductive wafer 100.

The thermal treatment 300 can be performed at a temperature of about 250-350° C. More specifically, the thermal treatment 300 can be performed at a temperature of 250° C. for about one hour. Alternatively, the thermal treatment 300 can be performed at a temperature of about 350° C. for about one minute. The temperature at which the thermal treatment 300 should be performed can be appropriately determined in consideration of a set of process conditions and process duration.

Figure 11:
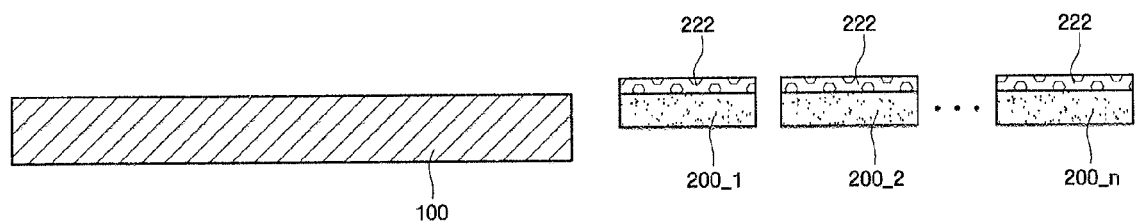
FIGS. 11 and 12 are diagrams illustrating a fourth exemplary embodiment of the wafer bonding method.
Figure 12:
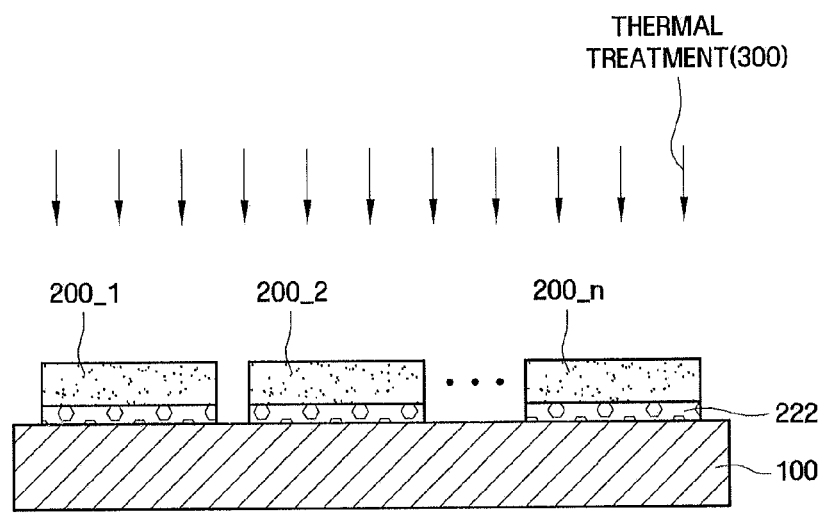

FIGS. 11 and 12 are diagrams illustrating a fourth exemplary embodiment of the wafer bonding method. The fourth exemplary embodiment of the wafer bonding method is different from the wafer bonding method of the third exemplary embodiment in that an organic layer is formed, not on the bonding surface of a conductive wafer 100, but on the bonding surfaces of a plurality of insulating wafers 200_1 through 200_n, as shown in FIG. 11.

More specifically, referring to FIG. 12, an intermediate material layer 222 can be formed on the insulating wafers 200_1 through 200_n; and then, the insulating wafers 200_1 through 200_n can be bonded onto the conductive wafer 100. Consequently, the intermediate material layer 222 may not be formed on portions of the conductive wafer 100 exposed among the insulating wafers 200_1 through 200_n.

Alternatively, an organic layer can be formed not only on the bonding surface of the conductive wafer 100 but also on the bonding surfaces of the insulating wafers 200_1 through 200_n; and then, the insulating wafers 200_1 through 200_n can be bonded onto the conductive wafer 100.

While the present invention has been particularly shown and described with reference to exemplary embodiments thereof, it will be understood by those of ordinary skill in the art that various changes in form and details can be made therein without departing from the spirit and scope of the present invention as defined by the following claims; further still, other aspects, functions and advantages are also within the scope of the invention. Additionally, steps, elements and features discussed herein in connection with one embodiment can likewise be used in conjunction with other embodiments. In describing embodiments of the invention, specific terminology is used for the sake of clarity. For purposes of description, each specific term is intended to at least include all technical and functional equivalents that operate in a similar manner to accomplish a similar result.

What is claimed is:

1. A wafer bonding method comprising:
providing an electrically conductive wafer, and a plurality of electrically insulating wafers, each wafer having a bonding surface, the bonding surface of the conductive wafer having an area greater than the area of the bonding surface of each insulating wafer;
forming an intermediate material layer on at least one of the bonding surface of the conductive wafer and the bonding surfaces of the insulating wafers, the intermediate material layer having a thermal expansion coefficient greater than the thermal expansion coefficient of the conductive wafer and the thermal expansion coefficient of the insulating wafers; and
bonding the bonding surfaces of the insulating wafers onto the bonding surface of the conductive wafer.

2. A wafer bonding method comprising:
providing a silicon wafer, and a plurality of sapphire wafers, each wafer having a bonding surface, the bonding surface of the silicon wafer having an area greater than the area of the bonding surface of each sapphire wafer;
forming an intermediate material layer on at least one of the bonding surface of the silicon wafer and the bonding surfaces of the sapphire wafers, the intermediate material layer having a thermal expansion coefficient greater than the thermal expansion coefficient of the silicon wafer and the thermal expansion coefficient of the sapphire wafers; and
bonding the bonding surfaces of the sapphire wafers onto the bonding surface of the silicon wafer.

3. A wafer bonding method comprising:
providing an electrically conductive wafer and a plurality of electrically insulating wafers, each wafer having a bonding surface, the bonding surface of the conductive wafer having an area greater than the area of the bonding surface of each insulating wafer;
forming a metal layer or an organic layer on at least one of the bonding surface of the conductive wafer and the bonding surfaces of the insulating wafers as an intermediate material layer;
laying the insulating wafers over the conductive wafer so that the bonding surfaces of the insulating wafers face the bonding surface of the conductive wafer; and
bonding the insulating wafers onto the conductive wafer by performing thermal treatment on the conductive wafer and the insulating wafers.

4. The wafer bonding method of claim 3, wherein the metal layer includes at least one of Au, Sn, Al, Pb, Cr, and Ti.

5. The wafer bonding method of claim 3, wherein:
the intermediate material layer is the metal layer; and performance of the thermal treatment is implemented at a temperature that is lower than or the same as the melting point of the metal layer.

6. The wafer bonding method of claim 3, further comprising washing the conductive wafer and the insulating wafers before forming the intermediate material layer.

7. The wafer bonding method of claim 3, wherein the intermediate material layer has a thermal expansion coefficient greater than about 1E-6/° C. and less than about 1E-4/° C.

8. The wafer bonding method of claim 3, wherein the bonding of the insulating wafers onto the conductive wafer comprises pressing the insulating wafers on the conductive wafer while performing thermal treatment on the conductive wafer and the insulating wafers.

9. The wafer bonding method of claim 3, wherein the conductive wafer is a silicon wafer, and the insulating wafers are sapphire wafers.

10. The wafer bonding method of claim 3, wherein the organic layer includes benzocyclobutene (BCB).

11. The wafer bonding method of claim 3, wherein:
the intermediate material layer is an organic layer; and
performance of the thermal treatment vitrifies the organic layer.

* * * * *